United States Patent
Jordan

(10) Patent No.: US 8,686,562 B2
(45) Date of Patent: Apr. 1, 2014

(54) REFRACTORY METAL NITRIDE CAPPED ELECTRICAL CONTACT AND METHOD FOR FRABRICATING SAME

(75) Inventor: Sadiki Jordan, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 237 days.

(21) Appl. No.: 12/583,809

(22) Filed: Aug. 25, 2009

(65) Prior Publication Data

US 2011/0049720 A1 Mar. 3, 2011

(51) Int. Cl.
*H01L 29/72* (2006.01)

(52) U.S. Cl.
USPC ........... 257/763; 257/267; 257/615; 257/750; 257/E21.158; 257/E23.012

(58) Field of Classification Search
USPC ............... 257/267, 615, 750, 763, E21.158, 257/E23.012
See application file for complete search history.

(56) References Cited

U.S. PATENT DOCUMENTS

| | | | |
|---|---|---|---|
| 5,902,129 A * | 5/1999 | Yoshikawa et al. | 438/592 |
| 2006/0027840 A1 * | 2/2006 | Wohlmuth | 257/267 |
| 2009/0309228 A1 * | 12/2009 | Fang et al. | 257/769 |
| 2010/0258912 A1 * | 10/2010 | Beach et al. | 257/615 |

* cited by examiner

*Primary Examiner* — Edward Wojciechowicz
(74) *Attorney, Agent, or Firm* — Farjami & Farjami LLP

(57) ABSTRACT

According to one disclosed embodiment, an electrical contact for use on a semiconductor device comprises an electrode stack including a plurality of metal layers and a capping layer formed over the plurality of metal layers. The capping layer comprises a refractory metal nitride. In one embodiment, a method for fabricating an electrical contact for use on a semiconductor device comprises forming an electrode stack including a plurality of metal layers over the semiconductor device, and depositing a refractory metal nitride capping layer of the electrode stack over the plurality of metal layers. The method may further comprise annealing the electrode stack at a temperature of less than approximately 875° C. In some embodiments, the method may additionally include forming one of a Schottky metal layer and a gate insulator layer between the electrode stack and the semiconductor device.

17 Claims, 3 Drawing Sheets

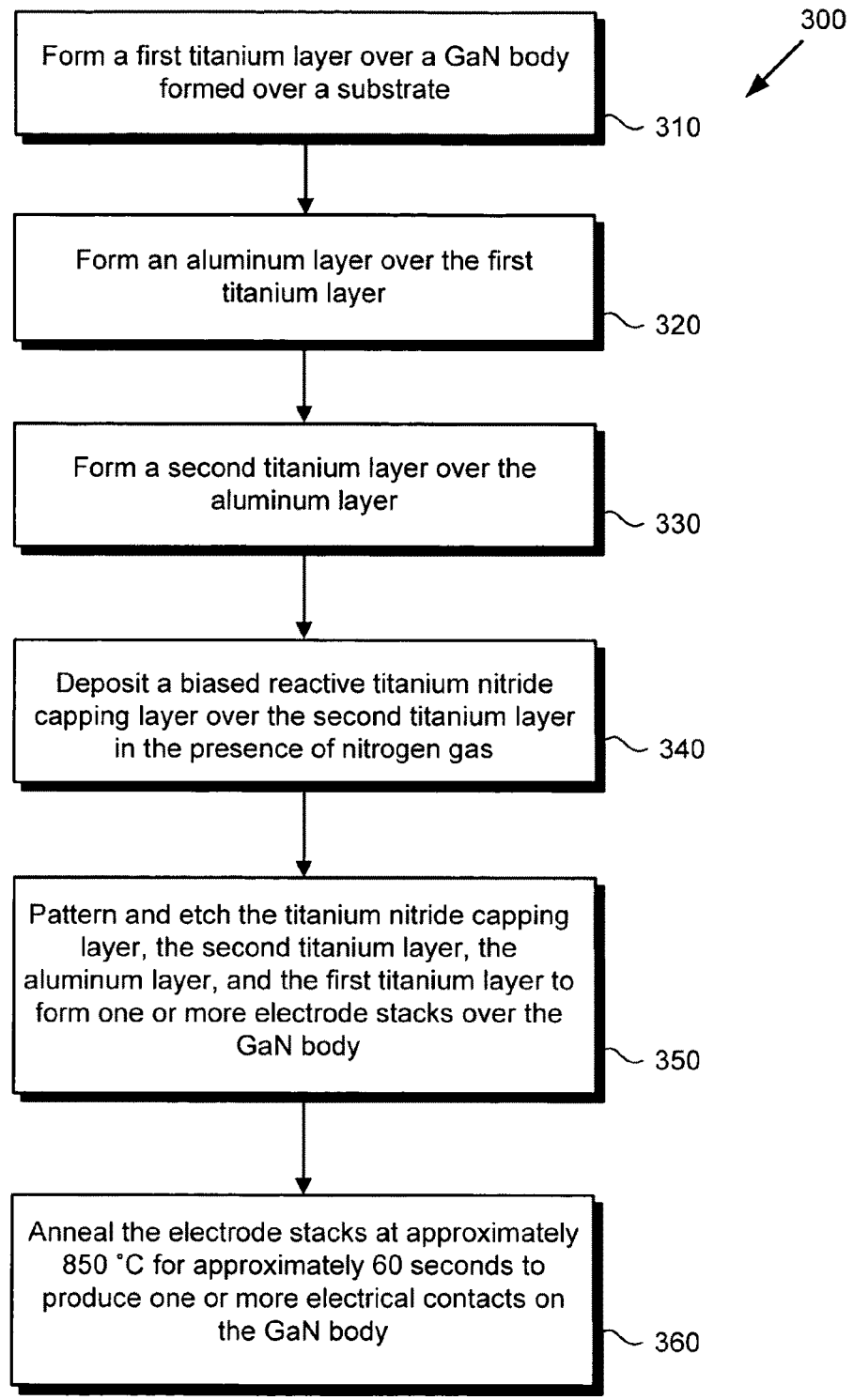

REFRACTORY METAL NITRIDE CAPPED ELECTRICAL CONTACT AND METHOD FOR FRABRICATING SAME

DEFINITION

In the present application, "group III-V semiconductor" refers to a compound semiconductor that includes at least one group III element and at least one group V element, such as, but not limited to, gallium nitride (GaN), gallium arsenide (GaAs), aluminum gallium arsenide (AlGaAs), indium gallium nitride (InGaN) and the like. Analogously, "III-nitride semiconductor" refers to a compound semiconductor that includes nitrogen and at least one group III element, such as, but not limited to, GaN, AlGaN, InN, AlN, InGaN, InAlGaN and the like.

BACKGROUND OF THE INVENTION

1. Field of the Invention

The present invention is generally in the field of semiconductor device fabrication. More specifically, the present invention is in the field of fabrication of compound semiconductor devices.

2. Background Art

It is generally desirable to merge the enhanced power handling capabilities of group III-V semiconductor power devices, such as III-nitride power transistors, and the energy efficiency and ease of fabrication of lower power silicon, or other group IV semiconductor devices, on a common die. However, traditional techniques for fabricating III-nitride power transistors make monolithic integration of those devices with commonly used silicon devices quite challenging.

For example, III-nitride power semiconductor device fabrication typically includes forming electrical contacts, such as ohmic source/drain contacts, having a low Specific Linear Contact Resistivity (SCLR). Conventional approaches to implementing electrical contacts displaying suitably low SCLR values on III-nitride devices have utilized aluminum as part of an electrode stack, and a noble metal, such as gold to form a capping layer of the stack. As a specific example, an electrical contact stack comprising pure films of titanium, aluminum, and nickel, capped with gold, has been widely used.

This conventional approach entails several significant drawbacks, however. One drawback is that use of gold as a capping layer is costly. Another is that gold has been found to diffuse through the electrode stack, as well as capping it, so that some gold undesirably appears at the interface of the electrical contact and the III-nitride semiconductor body. Yet another significant drawback to the use of gold as a capping layer is its propensity to contaminate a silicon fabrication process flow. Consequently, despite its favorable contribution to desirable SCLR values, the conventional approach to using gold as a capping layer for electrical contacts formed on III-nitride power semiconductor devices makes it particularly difficult to integrate those devices with silicon devices.

Thus, there is a need to overcome the drawbacks and deficiencies in the art by providing an electrical contact for use on a group III-V semiconductor device that renders integration of group III-V and group IV semiconductor devices more efficient and cost effective by posing a reduced contamination risk to silicon, or other group IV semiconductor fabrication process flows.

SUMMARY OF THE INVENTION

A refractory metal nitride capped electrical contact and method for fabricating same, substantially as shown in and/or described in connection with at least one of the figures, as set forth more completely in the claims.

BRIEF DESCRIPTION OF THE DRAWINGS

FIG. 3 is a flowchart presenting a method for fabricating a refractory metal nitride capped electrical contact, according to one embodiment of the present invention.

DETAILED DESCRIPTION OF THE INVENTION

Figure 1:
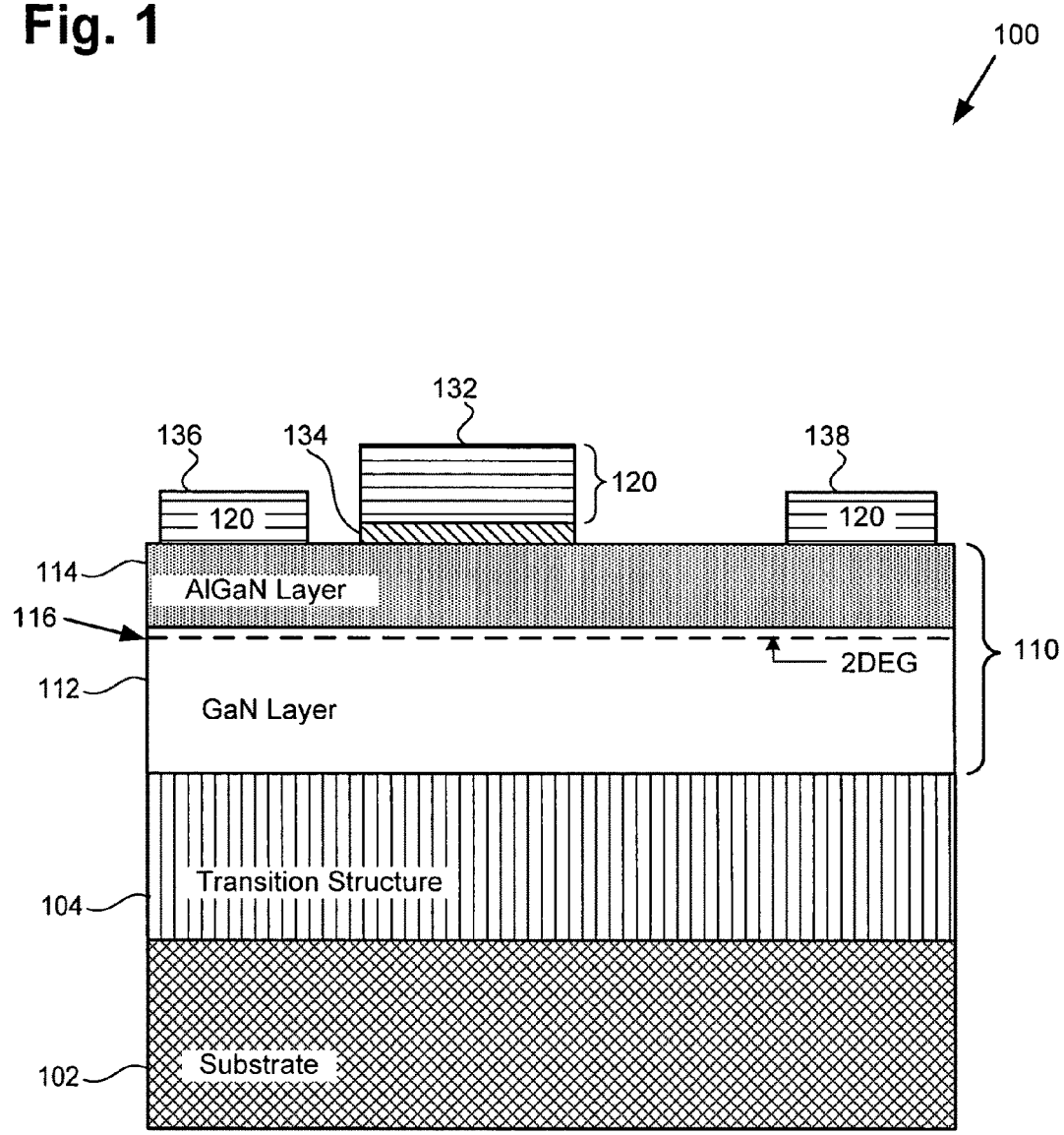
FIG. 1 is a block diagram showing a group III-V semiconductor device including a plurality of refractory metal nitride capped electrical contacts, according to one embodiment of the present invention.

The present invention is directed to a refractory metal nitride capped electrical contact and a method for its fabrication. More specifically, the present invention discloses such a contact for implementation as an electrode on a semiconductor device, such as a group III-V power semiconductor device, for example. Although the present inventive concepts are described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

FIG. 1 is a block diagram showing an example group III-V semiconductor device including a plurality of refractory metal nitride capped electrical contacts, according to one embodiment of the present invention. Structure 100, in FIG. 1, shows a specific implementation of the present inventive concepts. It should be understood that particular details such as the materials used to form structure 100 and the semiconductor device represented by structure 100, for example, are provided for conceptual clarity, and should not be interpreted as limitations.

As shown in FIG. 1, structure 100 comprises a group III-V semiconductor high electron mobility transistor (HEMT) implemented in gallium nitride (GaN). Structure 100 includes substrate 102, transition structure 104, and GaN body 110 comprising GaN layer 112 and aluminum gallium nitride (AlGaN) layer 114. Structure 100 also includes a plurality of electrical contacts including source electrode 136, drain electrode 138, and insulated gate electrode 132. Further shown in FIG. 1 is two-dimensional electron gas (2DEG) 116, which provides a conduction channel for the charge carriers of the HEMT, and is generated at the heterojunction formed by the interface of GaN layer 112 and AlGaN layer 114, in GaN body 110.

Substrate 102 may comprise any commonly utilized substrate material for GaN, such as sapphire, silicon, or silicon carbide, for example. As shown in FIG. 1, in the present embodiment, GaN body 110 is formed over transition structure 104, which is itself formed over substrate 102. It is noted that the present embodiment is merely one representation of a group III-V semiconductor device, however, and in other embodiments, transition structure 104 may not be utilized. For example, where substrate 102 is a suitable native substrate for GaN layer 112, GaN layer 112 may be formed on substrate 102, eliminating transition structure 104 entirely.

Where, however, as in the present embodiment, transition structure 104 is used, transition structure 104 may correspond to a plurality of distinguishable layers mediating the lattice transition from substrate 102 to GaN layer 112. Transition structure 104 may include, for example, a series of AlGaN layers comprising progressively less aluminum nitride and more gallium nitride, until a suitable transition to GaN layer 112 is achieved.

Source electrode 136 and drain electrode 138 are power electrodes ohmically coupled to the heterojunction formed by GaN layer 112 and AlGaN layer 114. Moreover, insulated gate electrode 132 is situated between source electrode 136 and drain electrode 138, on GaN body 110. As shown in FIG. 1, each of source electrode 136, drain electrode 138, and insulated gate electrode 132 comprises electrode stack 120. Electrode stack 120 includes a refractory metal nitride capping layer (not explicitly shown in FIG. 1), such as a titanium nitride (TiN) capping layer, for example. As further shown in FIG. 1, insulated gate electrode 132 includes gate insulator layer 134, such as a silicon nitride ($Si_3N_4$) or silicon dioxide ($SiO_2$) layer, for example, underlying electrode stack 120. It is noted that although in the embodiment of FIG. 1, gate electrode 132 is shown as an insulated gate electrode, in other embodiments, gate electrode 132 comprising electrode stack 120 may make Schottky contact with GaN body 110.

Figure 2:
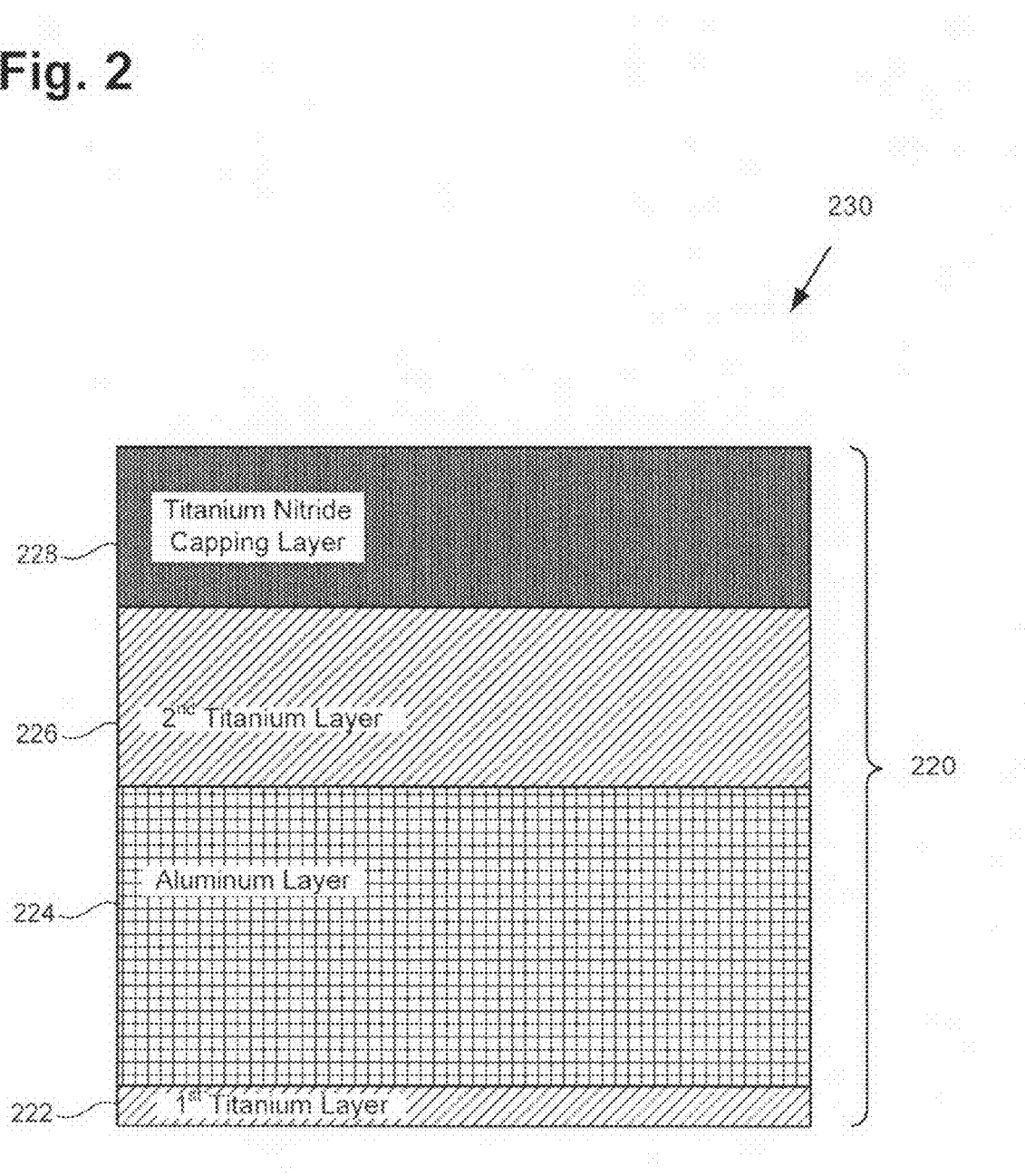
FIG. 2 is a more detailed block diagram showing a refractory metal nitride capped electrical contact, according to one embodiment of the present invention.

Turning now to FIG. 2, FIG. 2 is a more detailed block diagram showing a refractory metal nitride capped electrical contact, according to one embodiment of the present invention. FIG. 2 shows electrical contact 230 comprising electrode stack 220. Electrical contact 230 may be seen to correspond to any of source electrode 136, drain electrode 138, or insulated gate electrode 132, in FIG. 1. Electrode stack 220, which corresponds to electrode stack 120 in FIG. 1, includes first titanium (Ti) layer 222, aluminum (Al) layer 224, second Ti layer 226, and TiN capping layer 228.

More generally, electrode stack 220 corresponds to an electrode stack including a plurality metal layers, e.g., first Ti layer 222, Al layer 224, and second Ti layer 226, and a capping layer comprising a refractory metal nitride. The expression "refractory metal" may be interpreted in more than one way, as is commonly acknowledged in the art. For the purposes of the present application, the wider definition of refractory metal to include the elements Ti, zirconium (Zr), and vanadium (Vn), as well as the traditionally recognized refractory metals niobium (Nb), molybdenum (Mo), tantalum (Ta), and tungsten (W), is adopted. Thus, "refractory metal nitride" may refer to any of TiN, TaN, ZrN, VN, NbN, MoN, and $WN_2$, or any combination of those refractory nitride compounds.

Moreover, the number and character of the plurality of metal layers 222, 224, and 226 of electrode stack 220 are merely exemplary. As a result, in other embodiments, electrode stack 220 may comprise more, or fewer, metal layers underlying the refractory metal nitride capping layer, e.g., TiN capping layer 228, and the plurality of metal layers may be different from those shown in FIG. 2. For example, second Ti layer 226 may in other embodiments correspond to a nickel (Ni) layer, while in some embodiments Al layer 224 may further comprise silicon (Si) up to approximately ten percent (10%) by weight.

The present inventive concepts will be further described by reference to flowchart 300, in FIG. 3, which describes the steps, according to one embodiment of the present invention, of a method for fabricating a refractory metal nitride capped electrical contact. It is noted that certain details and features have been left out of flowchart 300 that are apparent to a person of ordinary skill in the art. For example, a step may comprise one or more substeps or may involve specialized equipment or materials, as known in the art. While steps 310 through 360 indicated in flowchart 300 are sufficient to describe one embodiment of the present invention, other embodiments of the invention may utilize steps different from those shown in flowchart 300.

Beginning with step 310 of flowchart 300 and referring to FIGS. 1 and 2, step 310 of flowchart 300 comprises forming first Ti layer 222 of electrode stack 120 over GaN body 110 formed over substrate 102. Any suitable deposition process may be used to form first Ti layer 222. For example, first Ti layer 222 may be sputter deposited over GaN body 110. Alternatively, Ti layer 222 may formed using a chemical vapor deposition (CVD) or electron beam deposition process, for example. It is contemplated that first Ti layer 222 is formed to a thickness of approximately 100 Å, plus or minus approximately ten percent (+/−10%). Although the present embodiment refers to formation of first Ti layer 222 over GaN body 110, it is emphasized that GaN body 110 may correspond to a body formed from any combination of suitable group III-V semiconductor materials, as described in the "Definition" section above.

Typically, the only constraint placed upon the composition of GaN body 110 is that it comprise at least one layer of a group III-V semiconductor material. In some embodiments, as shown in FIG. 1, GaN body 110 may comprise a first group III-V semiconductor layer, e.g., GaN layer 112, and a second group III-V semiconductor layer formed over the first III nitride semiconductor layer, e.g., AlGaN layer 114 formed over GaN layer 112, for example, wherein the second group III-V semiconductor layer comprises a group III-V semiconductor having a different, e.g., wider, band gap than the group III-V semiconductor forming the first group III-V semiconductor layer.

Continuing with step 320 of FIG. 3, step 320 of flowchart 300 comprises forming Al layer 224 of electrode stack 120 over first Ti layer 222 of electrode stack 120. As was the case for formation of first Ti layer 222, in step 310, formation of Al layer 224 in step 320 may proceed using any suitable deposition technique, such as sputter deposition, CVD, or electron beam deposition. As shown in FIG. 2, in the present embodiment, Al layer 224 is formed to a greater thickness than first Ti layer 222. Al layer 224 may be formed to a thickness of approximately 1300 Å, plus or minus approximately ten percent (+/−10%), for example.

Moving to step 330 of flowchart 300, step 330 comprises forming second Ti layer 226 of electrode stack 120 over Al layer 224 of electrode stack 120. Once again, formation of second Ti layer 226 in step 330 may proceed using any suitable deposition technique, such as sputter deposition, CVD, or electron beam deposition. As shown in FIG. 2, in the present embodiment, second Ti layer 226 is formed to a thickness greater than that of first Ti layer 222, and less than that of Al layer 224, but that representation is merely exemplary. In the present embodiment, for example, second Ti layer 226 may be formed to a thickness of approximately 680 Å, plus or minus approximately ten percent (+/−10%).

Continuing with step 340 of flowchart 300, step 340 comprises depositing biased reactive TiN capping layer 228 over second Ti layer 226. As is well known in the art, a species of TiN having a particularly high density, i.e., "biased reactive TiN" (also referred to in the art as "gold" TiN), can be formed by deposition of TiN onto a body supported by a substrate to which an appropriate biasing voltage is applied, in the presence of nitrogen gas with which the TiN reacts. Thus, in one embodiment, substrate 102 supporting GaN body 110, in FIG. 1, may receive a biasing voltage during deposition of TiN capping layer 228 of electrode stack 120, in a deposition chamber to which nitrogen gas has been introduced.

As shown in FIG. 2, in the present embodiment, TiN capping layer 228 is formed to a thickness comparable to that of second Ti layer 226. For example, TiN capping layer 228 may be formed to a thickness of approximately 600 Å, plus or minus approximately ten percent (+/−10%). As previously mentioned, other embodiments may employ a different refractory metal nitride capping layer in place of TiN capping layer 228. For instance, in one embodiment, refractory metal nitride capping of electrode stack 220 may be performed by a TaN capping layer corresponding to TiN capping layer 228.

In step 350 of flowchart 300, TiN capping layer 228, second Ti layer 226, Al layer 224, and first Ti layer 222 may be patterned and plasma etched to form one or more of electrode stacks 120 over GaN body 110. Subsequently, in step 360, electrode stacks 120 are annealed at approximately 850° C. for approximately sixty seconds to produce one or more electrical contacts, e.g., source contact 136 and/or drain contact 138, on GaN body 110. In some embodiments, annealing of electrode stacks 120, in step 360, may be performed in the presence of nitrogen gas.

Thus, according to the present invention, the novel refractory metal nitride capped electrical contact described herein presents significant advantages over the conventional art, such as rendering integration of group III-V and group IV semiconductor devices more efficient and cost effective by posing a reduced contamination risk to silicon, or other group IV semiconductor fabrication process flows.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. An electrical contact for use on a semiconductor device, said electrical contact comprising:
    an electrode stack including a plurality of metal layers and a capping layer formed over said plurality of metal layers;
    said capping layer consisting only of a refractory metal nitride, said refractory metal nitride forming a top of said electrical contact and having a thickness greater than that of a bottommost layer of said plurality of metal layers.

2. The electrical contact of claim 1, wherein said capping layer comprises titanium nitride (TiN).

3. The electrical contact of claim 1, wherein said capping layer comprises tantalum nitride (TaN).

4. The electrical contact of claim 1, wherein said plurality of metal layers includes respective first, second, and third metal layers, wherein said second metal layer is formed between said first metal layer and said third metal layer, and said capping layer is formed on said third metal layer.

5. The electrical contact of claim 4, wherein said first metal layer and said third metal layer of said electrode stack comprise titanium (Ti).

6. The electrical contact of claim 4, wherein said second metal layer of said electrode stack comprises aluminum (Al).

7. The electrical contact of claim 6, wherein said second metal layer of said electrode stack further comprises silicon (Si).

8. The electrical contact of claim 1, wherein said electrical contact is configured for implementation on a group III-V semiconductor device.

9. The electrical contact of claim 8, wherein said group III-V semiconductor device comprises a high electron mobility transistor (HEMT).

10. The electrical contact of claim 8, wherein said electrical contact is implemented as a power electrode making ohmic contact with said group III-V semiconductor device.

11. The electrical contact of claim 8, wherein said electrical contact is implemented as a gate electrode making Schottky contact with said group III-V semiconductor device.

12. The electrical contact of claim 8, wherein said electrical contact is implemented with a gate insulator layer underlying said first metal layer of said electrode stack to provide an insulated gate electrode for said group III-V semiconductor device.

13. An electrical contact for use on a group III-V semiconductor device, said electrical contact comprising:
    an electrode stack including a plurality of metal layers and a capping layer formed over said plurality of metal layers;
    said capping layer consisting only of a metal selected from the group consisting of titanium nitride (TiN) and tantalum nitride (TaN), said metal forming a top of said electrical contact and having a thickness greater than that of a bottommost layer of said plurality of metal layers.

14. The electrical contact of claim 13, wherein said group III-V semiconductor device comprises a high electron mobility transistor (HEMT).

15. The electrical contact of claim 13, wherein said electrical contact is implemented as a power electrode making ohmic contact with said group III-V semiconductor device.

16. The electrical contact of claim 13, wherein said electrical contact is implemented as a gate electrode making Schottky contact with said group III-V semiconductor device.

17. The electrical contact of claim 13, wherein said electrical contact is implemented with a gate insulator layer underlying a first metal layer of said electrode stack to provide an insulated gate electrode for said group III-V semiconductor device.

* * * * *